United States Patent
Bruza et al.

(10) Patent No.: US 6,653,358 B2
(45) Date of Patent: Nov. 25, 2003

(54) COMPOSITION CONTAINING A CROSS-LINKABLE MATRIX PRECURSOR AND A PORAGEN, AND A POROUS MATRIX PREPARED THEREFROM

(75) Inventors: Kenneth J. Bruza, Alma, MI (US); James P. Godschalx, Midland, MI (US); Edward O. Shaffer, II, Midland, MI (US); Dennis W. Smith, Jr., Seneca, SC (US); Paul H. Townsend, III, Midland, MI (US); Kevin J. Bouck, Midland, MI (US); Qing Shan J. Niu, Midland, MI (US)

(73) Assignee: Dow Global Technologies Inc., Midland, MI (US)

(*) Notice: Subject to any disclaimer, the term of this patent is extended or adjusted under 35 U.S.C. 154(b) by 0 days.

(21) Appl. No.: 10/283,551

(22) Filed: Oct. 29, 2002

(65) Prior Publication Data

US 2003/0092785 A1 May 15, 2003

Related U.S. Application Data

(62) Division of application No. 09/447,011, filed on Nov. 22, 1999.
(60) Provisional application No. 60/109,710, filed on Nov. 24, 1998.

(51) Int. Cl.$^7$ .................................................. C08J 9/02
(52) U.S. Cl. .......................... 521/77; 521/98; 521/134; 521/139
(58) Field of Search .............................. 521/77, 98, 134, 521/139

(56) References Cited

U.S. PATENT DOCUMENTS

| | | | |
|---|---|---|---|
| 3,705,118 A | 12/1972 | Abolafia et al. | 260/2.5 |
| 4,201,820 A | 5/1980 | Johnson | 428/195 |
| 4,272,467 A | 6/1981 | Johnson | 264/41 |
| 4,426,769 A | 1/1984 | Grabbe | 29/588 |
| 4,540,763 A | 9/1985 | Kirchhoff | 526/281 |
| 4,812,588 A | 3/1989 | Schrock | 556/453 |
| 4,859,715 A | 8/1989 | Dubrow et al. | 521/180 |
| 4,966,886 A | 10/1990 | Hoshiko | 505/1 |
| 5,021,602 A | 6/1991 | Clement et al. | 558/230 |
| 5,023,380 A | 6/1991 | Babb et al. | 568/34 |
| 5,037,917 A | 8/1991 | Babb et al. | 526/242 |
| 5,115,082 A | 5/1992 | Mercer et al. | 528/219 |
| 5,155,175 A | 10/1992 | Mercer et al. | 525/390 |
| 5,179,188 A | 1/1993 | Mercer et al. | 528/219 |
| 5,227,103 A | 7/1993 | Muschiatti | 264/45.9 |
| 5,235,044 A | 8/1993 | Mercer et al. | 534/551 |
| 5,246,782 A | 9/1993 | Kennedy et al. | 428/421 |
| 5,418,365 A | 5/1995 | Robin et al. | 250/338.2 |
| 5,422,377 A | 6/1995 | Aubert | 521/64 |
| 5,449,427 A | 9/1995 | Wojnarowski et al. | 156/155 |
| 5,540,997 A | 7/1996 | Perettie et al. | 428/409 |
| 5,550,405 A | 8/1996 | Cheung et al. | 257/642 |
| 5,554,305 A | 9/1996 | Wojnarowski et al. | 216/62 |
| 5,576,517 A | 11/1996 | Wojnarowski et al. | 174/262 |
| 5,591,677 A | 1/1997 | Jeng | 437/195 |
| 5,700,844 A | 12/1997 | Hedrick et al. | 521/77 |
| 5,714,243 A | 2/1998 | Mammino et al. | 428/306.6 |
| 5,726,211 A | 3/1998 | Hedrick et al. | 521/61 |
| 5,767,014 A | 6/1998 | Hawker et al. | 438/623 |
| 5,776,990 A | 7/1998 | Hedrick et al. | 521/77 |
| 5,785,787 A | 7/1998 | Wojnarowski et al. | 156/155 |
| 5,874,516 A | 2/1999 | Burgoyne, Jr. et al. | 528/219 |
| 5,883,219 A | 3/1999 | Carter et al. | 528/310 |
| 5,895,263 A | 4/1999 | Carter et al. | 438/624 |
| 5,965,679 A | 10/1999 | Godschalx et al. | 526/281 |
| 6,093,636 A | 7/2000 | Carter et al. | 438/623 |
| 6,107,357 A | 8/2000 | Hawker et al. | 521/77 |
| 6,110,649 A | 8/2000 | Carter et al. | 430/313 |
| 6,114,458 A | 9/2000 | Hawker et al. | 525/242 |
| 6,359,091 B1 | 3/2002 | Godschalx et al. | 526/285 |

FOREIGN PATENT DOCUMENTS

| | | |
|---|---|---|
| DE | 2 420 255 | 4/1974 |
| EP | 0 043 942 B1 | 8/1989 |
| EP | 0 512 401 A2 | 11/1992 |
| EP | 0 712 425 B1 | 7/1993 |
| EP | 0 610 929 B1 | 8/1994 |
| EP | 0 755 957 B1 | 1/1997 |
| FR | 2 700 883 | 7/1994 |
| JP | 61-137711 | 6/1986 |
| JP | 62-11617 | 1/1987 |
| JP | 1-254758 | 10/1989 |
| JP | 5-168880 | 7/1993 |
| JP | 7-182921 | 7/1995 |
| JP | 9-100363 | 4/1997 |
| WO | WO 91/09081 | 6/1991 |
| WO | WO 97/01593 | 1/1997 |
| WO | WO 97/10193 | 3/1997 |
| WO | WO 98/11149 | 3/1998 |

OTHER PUBLICATIONS

*Advanced Materials*, "Templating Nanoporosity in Thin–Film Dielectric Insulators**", Hedrick, et al., vol. 10, No. 13, 1998, pp. 1049–1053.

*Applied Physics. Letters*, "Structure and dielectric properties of thin polyimide films with nano–foam morphology", Cha, et al., vol. 68, No. 14, Apr. 1, 1996, pp. 1930–1932.

(List continued on next page.)

Primary Examiner—Morton Foelak
(74) *Attorney, Agent, or Firm*—Susan Moeller Zerull

(57) ABSTRACT

A suitable cross-linkable matrix precursor and a poragen can be treated to form a porous cross-linked matrix having a $T_g$ of greater than 300° C. The porous matrix material has a lower dielectric constant than the corresponding non-porous matrix material, making the porous matrix material particularly attractive for a variety of electronic applications including integrated circuits, multichip modules, and flat panel display devices.

15 Claims, No Drawings

OTHER PUBLICATIONS

*Applied Physics Lettes*, "Dielectric property and microstructure of a porous polymer material with ultralow dielectric constant", Xu, et al., vol. 75, No. 6, Aug. 9, 1999, pp. 853–855.

*European Polymer Journal*, "A Study of the Thermal Degradation of Methyl Methacrylate Polymers and Copolymers by Thermal Volatization Analysis", McNeill, vol. 4, 1968, pp. 21–30.

*High Performance Polymers*, "Polymide Foams Derived from Poly(4,4–Oxydiphenylpyrimellitimide) and Poly(α–Methylstyrene)", Hedrick, et al., vol. 7, 1995, pp. 133–147.

*Journal of American Chemical Society*, "Preparation of Polymers with Controlled Molecular Architecture. A New Convergent Approach to Dendritic Macromolecules", Hawker, et al., vol. 112, 1990, pp. 7638–7647.

*Journal of American Chemical Society*, "Hyperbranced Macromolecules via a Novel via a Novel Double–Stage Convergent Growth Approach", Wooley, et al., vol. 113, 1991, pp. 4252–4261.

*Journal of American Chemical Society*, "A General Copper–Catalyxed Synthesis of Diaryl Ethers", Marcoux, et al., vol. 119, 1997, pp. 10539–10540.

*Journal of American Chemical Society*, "Nanocages Derived from Shell Cross–Linked Micelle Templates", Huang, et al., Vo. 121, 1999, pp. 3805–3806.

*Journal of Chemical Society, C*, "Polyhalogeno–aromatic Compounds. Part VIII.1 Reactions of Hexa–bromobenzene with Nucleophiles", Collins, et al., 1969, pp. 2337–2341.

*Journal of Polymer Science*; Part A: Polymer Chemistry, "Thermal Crosslinking of Polymides and Polysulfone Using 3,3–Dimethyl–1–Phenyltriazene Compounds", Lau, et al., vol. 32, 1994, pp. 1093–1096.

*Journal of Polymer Science*; Part A: Polymer Chemistry, "Self–Crosslinkable Poly(arylene Ether)s Containing Pendent Phenylenetriazene Groups", Lau, et al., vol. 32, 1994, pp. 1507–1521.

*Journal of Polymer Science*; Part A: Polymer Chemistry, "High $T_g$ Polymide Nanofoams Derived from Pyromellitic Dianhydride and 1,1–Bis(4–aminophenyl)–1–Phenyl, –2,2, 2–Trifluoroethane", Hedrick, et al., vol. 34, 1996, pp. 2867–2877.

*Materials Research Society Symposium Proceedings*, "Templating nanopores into poly(methylsilsesquioxane): New low–dielectric coatings suitable for microelectronic applications" Remenar, et al., 1998.

*Materials Research Society Symposium Proceedings*, "Polyimide Nanofoams for Low Dielectric Applications", Carter, et al., vol. 381, 1995, pp. 79–91.

*Materials Research Society Symposium Proceedings*, "Recent Advances in Low K Polymeric Materials", Carter, pp. 87–97.

*Materials Research Society Symposium Proceedings*, "Preparation of Low–Density Xerogels at ambient Pressure for Low K Dielectrics", Smith, et al., vol. 381, 1995, pp. 261–266.

*Materials Research Society Symposium Proceedings*, "Deposition and Characterization of Porous Silica Xerogel Films", Jin, et al., vol. 443, 1997, pp. 99–104.

*Materials Research Society Symposium Proceedings*, "Nanoporous Silica for Low K Dielelctrics", Ramos, et al., vol. 443, 1997, pp. 91–98.

*Letters to Nature*, "Controlling polymer shape through the self–assembly of dendritic side–groups", Percec, et al., vol. 391, Jan. 8, 1998, pp. 161–164.

*Physics Today*, "Block Copolymers—Designer Soft Materials", Bates, et al., Feb. 1999, pp. 32–38.

*Polymer*, "High temperature polymer nanofoams based on amorphous, high Tg polymides", Charlier, et al., vol. 36, No. 5, 1995, pp. 987–1002.

*Polymer*, "Crosslinked polymide foams derived from pyromellitic dianhydride and 1,1–bis(4–aminophenyl)–1–phenyl–2,2,3–trifluoroethane with poly(α–methylstyrene)", Charlier, et al., vol. 36, No. 6, 1995, pp. 1315–1320.

*Polymer*, "Polymide foams prepared from homopolymer/ copolymer mixtures", Charlier, et al., vol. 26, No. 23, 1995, pp. 4529–4534.

*Polymer*, "The use of styrenic copolymers to generate polymide nanofoams", Hedrick, et al., vol. 36, No. 25, 1995, pp. 4855–4688.

*Polymer*, "Non–uniform composition profiles in thin film polymeric nanofoams", Fodor, et al., vol. 40, 1999, pp. 2547–2553.

*Polymer Degradation*, "The Effect of the Chemical Structure of Chain Ends on the Thermal Degradation of Polystyrene", L. Costa, et al., vol. 14, 1986, pp. 85–93.

*Polymer Journal*, "A New Class of Polymers: Starburst–Dendritic macromolecules", Tomalia, et al., vol. 17, No. 1, 1985, pp. 117–132.

*Polym. Mater. Science Eng.*; "Novel Crosslinking Regents Based on 3,3–Dimenthyl–1–Phenylentriazene", Lau & Vo, vol. 66, 1992, pp. 241–242.

*Polym. Mater. Science Eng.*; "Self–Crosslinkable Poly(arylene Ether)s Based on Phenylenetriazene Pendants", Lau & Vo, vol. 69, 1993, pp. 242–243.

*Polymer Preprints (ACS)*, "3,3–Dimethyl–1–Phenylenetriazene End–Capped Oligomers of Fluorinated Aryl Ether", Lau & Vo, vol. 33, 1992, pp. 996–997.

"Synthesis of Porous Polymers Utilizing Crystallization of Hydrophobic Long Alkyl Side Chains", Minamitani, et al., Kobunshi Ronbun, 1998, vol. 55, No. 3.

COMPOSITION CONTAINING A CROSS-LINKABLE MATRIX PRECURSOR AND A PORAGEN, AND A POROUS MATRIX PREPARED THEREFROM

CROSS-REFERENCE TO RELATED APPLICATION

This application is a division of U.S. patent application Ser. No. 09/447,011 filed Nov. 22, 1999, which claims priority from Provisional Application Ser. No. 60/109,710 filed on Nov. 24, 1998.

This invention was made with United States Government support under Cooperative Agreement No. 70NANB8H4013 awarded by NIST. The United States Government has certain rights in the invention.

BACKGROUND OF THE INVENTION

The present invention relates to a composition that contains a cross-linkable matrix precursor and a poragen, and a porous matrix prepared therefrom.

As semiconductor devices become smaller and smaller, and chip packing densities increase correspondingly, undesirable capacitatance related delays and cross-talk between metal interconnects are more acutely manifested. Since capacitance related delays and cross-talk relate to the dielectric constant of the insulator, attention has focused on the creation of ultra-low dielectric constant materials (that is, dielectric materials having dielectric constants of $\leq 2.0$). Such efforts include creating porous inorganic (for example, silicon dioxide) or thermoplastic polymeric (for example, polyimide) materials.

Silicon dioxide, which has been the dominant inter-level dielectric material (ILD) for the past 40 years, can be made porous by well-developed sol-gel techniques such as those disclosed in *Proc. Mat. Res. Soc.* 381, 261 (1995); *Proc. Mat. Res. Soc.* 443, 91 (1997); and *Proc. Mat. Res. Soc.* 443, 99 (1997), which teachings are incorporated herein by reference. Although the introduction of pores into silicon dioxide causes a reduction of dielectric constant from 4.2 to less than 2.0, the resultant porous material is significantly weakened. Thus, porous silicon dioxide is impractical as a low dielectric constant material.

Porous thermoplastic polymers, particularly thermally stable polymers such as polyimides, have also been investigated for use as ultra-low dielectric materials. See, for example, U.S. Pat. Nos. 5,895,263 and 5,776,990. Although these porous thermoplastic materials can be made to have acceptable dielectric constants, the pores tend to collapse during subsequent high temperature processing, thereby precluding the use of these materials for the applications of interest.

In view of the deficiencies in the art, it would be desirable to have an ultra-low dielectric material that is stable to the severe processing conditions required in fabricating semiconductors.

SUMMARY OF THE INVENTION

The present invention addresses the problems of the prior art by providing a composition comprising a) a hydrocarbon-containing matrix precursor; and b) a poragen; wherein the matrix precursor is selected to form upon curing a cross-linked, hydrocarbon-containing material having a $T_g$ of greater than 300° C. The cross-linked hydrocarbon-containing material preferably has a thermal stability of at least 400° C.

In a second embodiment, the present invention is a low dielectric constant material comprising a porous cross-linked hydrocarbon-containing matrix having a $T_g$ of greater than 300° C. The material is preferably in the form of a thin film on a substrate.

In a third embodiment, the present invention is a method of making a porous film on a substrate comprising:

coating on a substrate, a solution comprising a matrix precursor which cures to form a matrix material having a Tg of at least 300° C., a poragen, and a solvent;

removing the solvent;

reacting the matrix precursor to form the matrix material; and degrading the poragen to form pores in the matrix.

The removing, reacting, and degrading steps are performed by one or more heating steps as will be more thoroughly described below.

In a fourth embodiment, the present invention is an integrated circuit article comprising an active substrate containing transistors and an electrical interconnect structure containing patterned metal lines separated, at least partially, by layers or regions of a porous dielectric material, wherein the dielectric material comprises a cross-linked hydrocarbon-containing matrix having a $T_g$ of greater than 300° C.

The present invention solves a problem in the art by providing a low dielectric constant, porous matrix material that is suitable as an interlayer dielectric for microelectronics applications and stable to processing temperature of greater than 300° C.

DEFINITIONS

B-Staged—refers to a partially polymerized monomer, or a mixture of monomer and partially polymerized monomer. A b-staged product is usually synonymous with "prepolymer" or "oligomer."

Cross-linkable—refers to a matrix precursor that is capable of being irreversibly cured, to a material that cannot be reshaped or reformed. Cross-linking may be assisted by UV, microwave, x-ray, or e-beam irradiation. Often used interchangeably with "thermosettable" when the cross-linking is done thermally.

Matrix precursor—a monomer, prepolymer, or polymer, or mixtures thereof which upon curing forms a cross-linked Matrix material.

Monomer—a polymerizable compound or mixture of polymerizable compounds.

Functionality—refers to the number of groups in a monomer available for polymerization. For example, a biscyclopentadienone and a bis-acetylene each have a functionality of 2, while the monomer 1,1,1-tris(4-trifluorovinyloxyphenyl)ethane has a functionality of 3.

Hydrocarbon-containing—refers to a matrix or matrix precursor that contains carbon and hydrogen, but may contain other elements. The matrix or matrix precursor preferably contains not more than 50 weight percent silicon, more preferably not more than 30 weight percent silicon, and most preferably not more than 20 weight percent silicon.

Poragen—a solid, liquid, or gaseous material that is removable from a partially or fully cross-linked matrix to create pores or voids in a subsequently fully cured matrix, thereby lowering the effective dielectric constant of the resin.

Thermal stability temperature—the maximum temperature, T, at which the weight loss of a sample maintained at that temperature in an inert environment is less than 1 percent per hour.

Matrix—a continuous phase surrounding dispersed regions of a distinct composition. In the final article, the matrix is a solid phase surrounding dispersed voids or pores.

DETAILED DESCRIPTION OF THE INVENTION

The porous matrix of the present invention can be prepared from a mixture of a poragen and a cross-linkable hydrocarbon-containing matrix precursor. The poragen may be reactive, so that the poragen becomes chemically bonded into the polymer matrix, or it may be non-reactive.

Matrix Precursors

Suitable matrix precursors are those that form cross-linked resins having a $T_g$ of greater than 300° C. and more preferably greater than 350° C.

Preferably, the matrix precursors are further characterized in that they experience either no decrease or only relatively small decreases in modulus during cure. If the material experiences large modulus drops during cure, especially if the low modulus occurs at temperatures near the degradation temperature of the poragen, pore collapse may occur.

One preferred class of matrix precursors include thermosettable benzocyclobutenes (BCBs) or b-staged products thereof, such as those described in U.S. Pat. No. 4,540,763 and U.S. Pat. No. 4,812,588, which teachings are incorporated herein by reference. A particularly preferred BCB is 1,3-bis(2-bicyclo[4.2.0]octa-1,3,5-trien-3-ylethynyl)-1,1,3, 3-tetramethyldisiloxane (referred to as DVS-bisBCB), the b-staged resin of which is commercially available as CYCLOTENE™ resin (from The Dow Chemical Company).

Another second preferred class of matrix materials include polyarylenes. Polyarylene, as used herein, includes compounds that have backbones made from repeating arylene units and compounds that have arylene units together with other linking units in the backbone, e.g. oxygen in a polyarylene ether. Examples of commercially available polyarylene compositions include SiLK™ Semiconductor Dielectric (from The Dow Chemical Company), Flare™ dielectric (from Allied Signal, Inc.), and Velox™ (Poly(arylene ether)) (from AirProducts/Shumacher). A preferred class of polyarylene matrix precursor is a thermosettable mixture or b-staged product of a polycyclopentadienone and a polyacetylene, such as those described in WO 98/11149, which teachings are incorporated herein by reference. Examples of the thermosetting compositions or cross-linkable polyarylenes that may be used in the composition of this invention include monomers such as aromatic compounds substituted with ethynylic groups ortho to one another on the aromatic ring as shown in WO 97/10193, incorporated herein by reference; cyclopentadienone functional compounds combined with aromatic acetylene compounds as shown in WO 98/11149, incorporated herein by reference; and the polyarylene ethers of U.S. Pat. Nos. 5,115,082; 5,155,175; 5,179,188 and 5,874,516 and in PCT WO 91/09081; WO 97/01593 and EP 0755957-81, all of which are incorporated herein by reference. More preferably, the thermosetting compositions comprise the partially polymerized reaction products (i.e., b-staged oligomers) of the monomers mentioned above (see e.g., WO 98/11149, WO 97/10193).

Preferably, the polyarylene precursors are characterized by a modulus profile as measured by torsional impregnated cloth analysis (TICA) characterized in that during heating of the composition a Minimum Measured Modulus observed in the temperature range from 300° C. to 400° C. occurs at a temperature $T_{min}$, and said Minimum Measured Modulus is greater than a value equal to 20 percent, more preferably 50 percent, of a Measured Cured Modulus of the composition after heating to a maximum temperature and cooling back down to $T_{min}$. "Measured Heat-up Modulus" is the modulus at a given temperature detected for the test composite during the heating phase of the test on a plot of modulus versus temperature. "Minimum Measured Heat-up Modulus" is the minimum Measured Heat-up Modulus occurring in the temperature range of 300 to 450° C. "Measured Cured Modulus" is the modulus at a given temperature for the test composite during the cool down phase. In this TICA technique, a woven glass cloth (preferably, 0.3 mm thick, 15 mm wide, and 35 mm long e.g., TA Instruments part number 980228.902) is mounted in a dynamic mechanical analyzer, such as a DuPont 983 DMA, preferably fitted with a Low Mass Vertical Clamp Accessory or equivalent functionality to enhance sensitivity. The ends of the cloth are wrapped in aluminum foil leaving 10 mm in length exposed. The cloth is then mounted in the vertical clamps of the dynamic mechanical analyzer which are set 10 mm apart. The clamps are tightened to about 12 inch pounds using a torque wrench. The cloth is impregnated using a solution comprising the precursor compounds at 10 to 30 percent solids via a pipet. The cloth is thoroughly soaked with the solution and any excess is removed using the pipet. A heat deflector and oven are attached and a nitrogen flow of about 3 standard cubic feet per hour is established. Amplitude of the displacement is set to 1.00 mm and frequency to 1 Hz. The sample is heated to 500° C. at 5° C. per minute and then allowed to cool. Data is collected during both the heating and cooling stages. Data analysis may be performed to obtain temperature versus flexural modulus values for the composite of glass and formulation. Prepared software programs such as DMA Standard Data Analysis Version 4.2 from DuPont or Universal Analysis for Windows 95/98/NT Version 2.5H from TA Instruments, may be used to perform the data analysis. The modulus values themselves are not absolute values for the tested formulation due to the contribution of the glass cloth and the unavoidable variation in sample loading. However, using ratios of the modulus value at a point during heating to a modulus of the composite after cure and cool down to some consistent temperature gives a value, which can be used to compare different formulations. See also related U.S. Pat. No. 6,359,091.

Preferred polyarylene-type matrix precursors comprise the following compounds, or more preferably, a partially polymerized (b-staged) reaction product of the following compounds:

(a) a biscyclopentadienone of the formula:

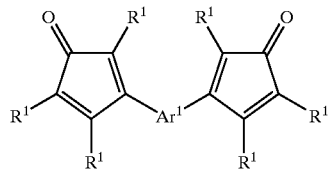

(b) a polyfunctional acetylene of the formula:

(c) and, optionally, a diacetylene of the formula:

wherein $R^1$ and $R^2$ are independently H or an unsubstituted or inertly-substituted aromatic moiety and $Ar^1$, $Ar^2$ and $Ar^3$ are independently an unsubstituted aromatic moiety, or inertly-substituted aromatic moiety, and y is an integer of three or more. Stated alternatively, the most preferred matrix precursor material comprises a curable polymer of the formula:

wherein A has the structure:

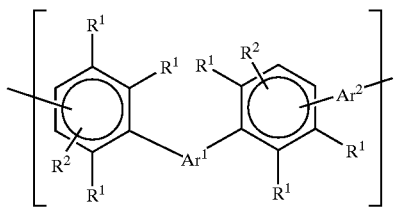

and B has the structure:

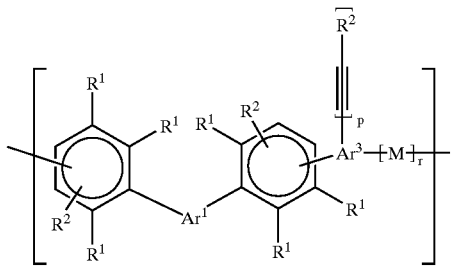

end groups EG are independently represented by any one of the formulas:

EG =

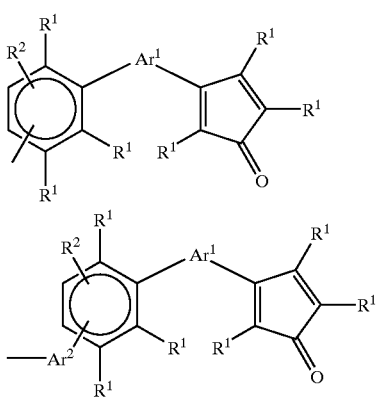

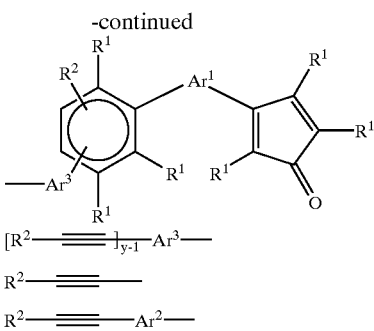

wherein $R^1$ and $R^2$ are independently H or an unsubstituted or inertly-substituted aromatic moiety and $Ar^1$, $Ar^2$ and $Ar^3$ are independently an unsubstituted aromatic moiety or inertly-substituted aromatic moiety and M is a bond, y is an integer of three or more, p is the number of unreacted acetylene groups in the given mer unit, r is one less than the number of reacted acetylene groups in the given mer unit and p+r=y−1, z is an integer from 1 to about 1000; w is an integer from 0 to about 1000 and v is an integer of two or more.

When the matrix precursor comprises a thermosettable mixture or b-staged product of a polycyclopentadienone and a polyacetylene, the precursors preferably are characterized so that branching occurs relatively early during the curing process. Formation of a branched matrix early on in the cure process minimizes the modulus drop of the matrix, and helps minimize possible pore collapse, during the cure process, and/or allows for use of poragens that decompose or degrade at lower temperatures. One approach for achieving this is to use a ratio of cyclopentadienone functionality to acetylene functionality in the precursor composition of greater than about 3:4, and preferably less than about 2:1, more preferably about 1:1. A matrix precursor comprised of 3 parts 3,3'-(oxydi-1,4-phenylene)bis(2,4,5-triphenycyclpentadienone) and 2 parts 1,3,5-tris(phenylethynyl)benzene (molar ratios) is an example of such a system. Alternatively, additional reagents capable of cross-linking the thermosettable mixture or b-staged product of a polycyclopentadienone and a polyacetylene can be added to minimize the modulus drop of the matrix during the cure process. Examples of suitable reagents include bisorthodiacetylenes as disclosed, for example, in WO 97/10193, incorporated herein by reference; monoorthodiacetylenes; bistriazenes; tetrazines, such as 1,3-diphenyltetrazine; bisazides, such as bissulfonylazides; and peroxides, including diperoxides. The loading levels of the reagent can vary from <1 weight percent based on solids to >30 weight percent based on solids.

A third example of a matrix precursor suitable for the preparation of the porous matrix of the present invention is a thermosettable perfluoroethylene monomer (having a functionality of 3 or more) or a b-staged product thereof, the disclosure and preparation of which can be found in U.S. Pat. No. 5,023,380 (col. 4, starting on line 38), and U.S. Pat. No. 5,540,997 (col. 3, lines 4 to 46), which teachings are incorporated herein by reference. A preferred thermosettable perfluoroethylene is 1,1,1-tris(4-trifluorovinyloxyphenyl) ethane. The thermosettable perfluoroethylene monomer may also be conveniently copolymerized with a perfluoroethylene monomer having a functionality of two, prepared as described in U.S. Pat. Nos. 5,021,602; 5,037,917; and 5,246,782. Another polyarylene matrix precursor is a thermosettable bis-o-diacetylene or b-staged product thereof as described in WO 97/10193, which teachings are incorporated herein by reference. According to this embodiment the precursor comprises a compound of the formula

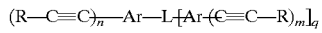

wherein each Ar is an aromatic group or inertly-substituted aromatic group and each Ar comprises at least one aromatic ring; each R is independently hydrogen, an alkyl, aryl or inertly-substituted alkyl or aryl group; L is a covalent bond or a group which links one Ar to at least one other Ar; preferably a substituted or unsubstituted alkyl group, n and m are integers of at least 2; and q is an integer of at least 1, and wherein at least two of the ethynylic groups on one of the aromatic rings are ortho to one another.

Poragens and Methods of Forming Porous Cross-Linked Dielectrics

The poragen materials are materials that will form domains (or discrete regions) in the matrix or matrix precursor. Preferably, the domains should be no larger than the final desired pore size.

Many polymeric materials may be useful as poragens. However, a poragen that functions well with a first matrix system will not necessarily function well with another matrix system. The compatibility poragen with the matrix system must be high enough that very large domains are not formed but cannot be so high that no domains are formed.

The poragens useful in this invention are preferably those that thermally degrade (i.e., burnout) at temperatures below the thermal stability temperature of the matrix material. The degradation temperature range may overlap with the curing temperature range so long as curing occurs more quickly than (or before) degradation allowing the matrix to set before the poragen is substantially removed. These materials preferably decompose primarily into low molecular weight species and, thus, do not leave substantial "char" in the porous matrix.

Examples of poragens and methods by which they can be used in conjunction with the matrix precursor to form porous cross-linked matrix materials are described as follows.

The poragen may be a block copolymer (e.g., a di-block polymer). Such materials may be capable of self-assembling, as described in *Physics Today,* February 1999, p. 32, if the blocks are immiscible to give separated domains in the nanometer size range. Such a block copolymer can be added to the cross-linkable matrix precursor with or without solvent to obtain a formulation suitable for processing. The block copolymer can self-assemble during processing (e.g., after spin coating, but before the matrix is formed). One or more of the blocks may be reactive with the matrix or the blocks may be non-reactive. One or more of the blocks may be compatible with the matrix, or its precursor, but preferably at least one block is incompatible with the matrix. Useful polymer blocks can include an oligomer of the matrix precursor, polyvinyl aromatics, such as polystyrenes, polyvinylpyridines, hydrogenated polyvinyl aromatics, polyacrylonitriles, polyalkylene oxides, such as polyethylene oxides and polypropylene oxides, polyethylenes, polylactic acids, polysiloxanes, polycaprolactones, polycaprolactams, polyurethanes, polymethacrylates, such as polymethylmethacrylate or polymethacrylic acid, polyacrylates, such as polymethylacrylate and polyacrylic acid, polydienes such as polybutadienes and polyisoprenes, polyvinyl chlorides, polyacetals, and amine-capped alkylene oxides (commercially available as Jeffamine™ polyether amines from Huntsman Corp.) For example, a diblock polymer based on polystyrene and polymethylmethacrylate can be added to a solution of CYCLOTENE™ resin in a suitable solvent such as mesitylene at a weight:weight ratio of resin to diblock polymer of preferably not less than about 1:1, and more preferably not less than about 2:1, and most preferably not less than about 3:1. The overall solids content is application dependent, but is preferably not less than about 1, more preferably not less than about 5, and most preferably not less than about 10 weight percent, and preferably not greater than about 70, more preferably not greater than about 50, and most preferably not greater than 30 weight percent. The solution can then be spin-coated onto a silicon wafer leaving a thin film containing a dispersed phase of diblock copolymer in a continuous phase of DVS-bisBCB. The film can then be thermally cured leaving a crosslinked polymer system containing a dispersed phase of poly(styrene-b-methylmethacrylate) in a continuous phase of cross-linked DVS-bisBCB. The diblock copolymer can then be decomposed or removed to leave a porous cross-linked DVS-bisBCB polymer. Similarly, a diblock polymer based on polystyrene and polybutadiene can be added to a b-staged solution of a dicyclopentadienone (e.g., 3,3'-(oxydi-1,4-phenylene)bis(2,4,5-triphenycyclpentadienone)) and a trisacetylene (e.g., 1,3,5-tris(phenylethynyl)benzene).

Thermoplastic homopolymers and random (as opposed to block) copolymers may also be utilized as poragens. As used herein, "homopolymer" means compounds comprising repeating units from a single monomer. Suitable thermoplastic materials include polystyrenes, polyacrylates, polymethacrylates, polybutadienes, polyisoprenes, polyphenylene oxides, polypropylene oxides, polyethylene oxides, poly(dimethylsiloxanes), polytetrahydrofurans, polyethylenes, polycyclohexylethylenes, polyethyloxazolines, polyvinylpyridines, polycaprolactones, polylactic acids, copolymers of these materials and mixtures of these materials. The thermoplastic materials may be linear, branched, hyperbranched, dendritic, or star like in nature.

Polystyrene has been found to be particularly suitable with thermosettable mixtures or b-staged products of a polycyclopentadienone and a polyacetylene, such as those described in WO 98/11149, because it decomposes at a high temperature (e.g., around 420° C. to 450° C.) and also decomposes primarily into the monomer which can then diffuse out of the matrix. Any known polystyrene may be useful as the porogen. For example, anionic polymerized polystyrene, syndiotactic polystyrene, unsubstituted and substituted polystyrenes (e.g., poly(α-methyl styrene)) may all be used as the poragen. Unsubstituted polystyrene is especially preferred.

For example, an anionically polymerized polystyrene with a number average molecular weight of 8,500 can be blended with a polyarylene b-staged reaction product of a polycyclopentadienone and a polyacetylene. This solution can then be spin-coated onto a silicon wafer to create a thin film containing the dispersed phase of polystyrene in the polyarylene matrix precursor. The coated wafer is cured on a hot plate to form the matrix, then the polystyrene poragen is removed by thermal treatment in an oven to form a porous polyarylene matrix.

The poragen may also be designed to react with the cross-linkable matrix precursor during or subsequent to b-staging to form blocks or pendant substitution of the polymer chain. Thus, thermoplastic polymers containing, for example, reactive groups such as vinyl, acrylate, methacrylate, allyl, vinyl ether, maleimido, styryl, acetylene, nitrile, furan, cyclopentadienone, perfluoroethylene, BCB, pyrone, propiolate, or ortho-diacetylene groups can form chemical bonds with the cross-linkable matrix precursor, and then the thermoplastic can be removed to leave pores. The thermoplastic polymer can be homopolymers or copolymers of polystyrenes, polyacryclates, polymethacrylates, polybutadienes, polyisoprenes, polyphenylene oxides, polypropylene oxides, polyethylene oxides, poly (dimethylsiloxanes), polytetrahydrofurans, polyethylenes, polycyclohexylethylenes, polyethyloxazolines, polycaprolactones, polylactic acids, and polyvinylpyridines or mixtures thereof. A single reactive group or multiple reactive groups may be present on the thermoplastic. The number and type of reactive group will determine whether the thermoplastic poragen is incorporated into the matrix as a pendant material or as a block. The thermoplastic materials may be linear, branched, hyperbranched, dendritic, or star like in nature.

For example, a low molecular weight (<10,000 $M_n$) polypropylene glycol oligomer can be end-capped with cinnamate groups, then added at about 10 to about 30 weight percent to a neat DVS-bisBCB monomer. This mixture can then be b-staged by heating, then diluted with a suitable solvent such as mesitylene and spin-coated onto a silicon wafer to create a thin film containing a dispersed phase of polypropylene glycol oligomers chemically bonded to the b-staged DVS-bisBCB. The dispersed polypropylene glycol oligomers can then be decomposed to leave a porous cross-linked DVS-bisBCB polymer.

The desired molecular weight of polymeric poragens will vary with a variety of factors, such as their compatibility with the matrix precursor and cured matrix, the desired pore size, etc. Generally, however, the number average molecular weight of the poragen is greater than about 2000 and less than about 100,000. More preferably the molecular weight is in the range of about 5000 to about 50,000 and most preferably less than about 35,000. The poragen polymer also preferably has a narrow molecular weight distribution.

The poragen may also be a material that has an average diameter of about 1 to about 50 nm. Examples of such materials include dendrimers (polyamidoamine (PAMAM), dendrimers are available through Dendritech, Inc., and described by Tomalia, et al., *Polymer J.* (Tokyo), Vol. 17, 117 (1985), which teachings are incorporated herein by reference; polypropylenimine polyamine (DAB-Am) dendrimers available from DSM Corporation; Frechet type polyethereal dendrimers (described by Frechet, et al., *J. Am. Chem. Soc.*, Vol. 112, 7638 (1990), Vol. 113, 4252(1991)); Percec type liquid crystal monodendrons, dendronized polymers and their self-assembled macromolecules (described by Percec, et al., *Nature*, Vol. 391, 161(1998), *J. Am. Chem. Soc.*, Vol. 119, 1539(1997)); hyperbranched polymer systems such as Boltron H series dendritic polyesters (commercially available from Perstorp AB) and latex particles, especially cross-linked polystyrene containing latexes. These materials may be non-reactive with the cross-linkable matrix precursor, or reactive as described above. For example, a generation 2 PAMAM (polyamidoamine) dendrimer from Dendritech, Inc. can be functionalized with vinyl benzyl chloride to convert amine groups on the surface of the dendrimer to vinyl benzyl groups. This functionalized dendrimer can then be added to a solution of b-staged DVS-bisBCB in mesitylene, and the mixture can then be spin-coated on a silicon wafer to obtain a dispersed phase of PAMAM dendrimer in DVS-bisBCB oligomers. The film can be thermally cured to obtain a cross-linked polymer system containing a dispersed phase of PAMAM dendrimer chemically bonded to a continuous phase of cross-linked DVS-bisBCB. The dendrimer can then be thermally decomposed to obtain the porous cross-linked DVS-bisBCB polymer. Alternatively, a generation 4 Boltron dendritic polymer (H40) from Perstorp AB can be modified at its periphery with benzoyl chloride to convert hydroxy groups on the surface of the dendrimer to phenyl ester groups. This functionalized dendrimer can then be added to a precursor solution of partially polymerized (i.e., b-staged) reaction product of a polycyclopentadiene compound and a polyacetylene compound in a solvent mixture of gamma-butyrolactone and cyclohexanone. The mixture can then be spin-coated on a silicon wafer to obtain a dispersed phase of Boltron H40 benzoate dendritic polymers in precursor oligomers. The film can be thermally cured to obtain a cross-linked polymer system containing a dispersed phase of dendrimer chemically bonded to a continuous phase of cross-linked polyarylene. The dendrimer can then be thermally decomposed at 400° C. to obtain the porous cross-linked polyarylene.

Alternatively, the poragen may also be a solvent. For example, a b-staged prepolymer or partially cross-linked polymer can first be swollen in the presence of a suitable solvent or a gas. The swollen material can then be further cross-linked to increase structural integrity, whereupon the solvent or gas can be removed by applying vacuum or heat. Suitable solvents would include mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and ethers or hydroxy ethers such as dibenzylethers, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether, tripropylene glycol methyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof.

The concentration of pores in the porous matrix is sufficiently high to lower the dielectric constant of the matrix but sufficiently low to allow the matrix to withstand the process steps required in the manufacture of the desired microelectronic device (for example, an integrated circuit, a multichip module, or a flat panel display device). Preferably, the density of pores is sufficient to lower the dielectric constant of the matrix to less than 2.5, more preferably to less than 2.0. Preferably, the concentration of the pores is at least 5 volume percent, more preferably at least 10 volume percent and most preferably at least 20 volume percent, and preferably not more than 70 volume percent, more preferably not more than 60 volume percent based on the total volume of the porous matrix.

The average diameter of the pores is preferably less than about 400 nm; more preferably, less than 100 nm; more preferably still, not more than about 50 nm; even more preferably, not more than about 20 nm; and most preferably, not more than about 10 nm.

Methods of Preparing a Porous Matrix Layer

While not being bound by theory, it is thought that the following events occur during the processing of solutions containing a matrix precursor and a poragen. The solution of matrix precursor and poragen is applied to a substrate by a method such as spin coating. During this application some of the solvent evaporates leaving a more concentrated solution on the substrate. The coated substrate is then heated on a hot plate to remove most of the remaining solvent(s) leaving the poragen dispersed in the matrix precursor. During the solvent removal process and/or during subsequent thermal processing, the poragen phase separates from the matrix precursor. This phase separation may be driven by loss of solvent (concentration effect and/or change in solubility parameter of the solution), increases in molecular weight of the matrix precursor, assembly or aggregation of sufficient poragen mass in a specific location, or combinations thereof. With further heat treatments, the matrix becomes more fully cured. At an elevated temperature the poragen begins to decompose into fragments which can diffuse out of the coated film leaving behind a pore, thus forming a porous matrix.

The matrix precursor, the poragen and a solvent are combined and mixed to form an optically clear solution. The amount of matrix precursor relative to the amount of poragen may be adjusted to give the desired porosity. However, preferably, the weight percent of poragen based on weight of poragen and matrix is at least 5 percent, more preferably at least 10 percent, and most preferably at least 20 percent. The maximum amount of poragen will be determined by the mechanical and electrical properties desired in the final product. Preferably, the weight percent poragen is no greater than 80 percent, more preferably no greater than 70 percent, and most preferably no greater than 60 percent.

Sufficient solvent to provide an optically clear solution should be used. In addition, the amount of solvent may be varied to allow one to get various coating thicknesses. The more solvent that is used, the thinner the layer of the final film. Preferably, the amount of solvent is in the range of 50–95 percent by weight of the total solution.

Any known coating method may be used to apply the precursor/poragen/solvent composition to a substrate. Spin coating is particularly suitable for providing the very thin film layers desired. Preferred film thicknesses are less than about 10 microns, preferably less than about 5 microns, for interlevel dielectric films. The composition may be applied to any substrate where a thin porous film is desired. Preferably, the substrate comprises a silicon wafer. The substrate may further comprise other layers or features such as are found in integrated circuits (e.g., gates, metal interconnect lines, other insulating materials, etc.).

The solvents used may be any solvent or combination of solvents in which the combination of poragen and matrix precursor forms a solution. Examples of suitable solvents include mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and ethers or hydroxy ethers such as dibenzylethers, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether, tripropylene glycol methyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof.

The poragen and matrix precursor may be simply mixed prior to application or they may be partially reacted or b-staged prior to application of the solution to the desired substrate. The poragen may be added at various stages of the matrix precursor B-staging process as desired.

After the matrix precursor film is formed, the film can be baked under conditions sufficient to remove solvent and cause further polymerization of the matrix precursor. Baking temperature is system dependent and can be determined by one of ordinary skill in the art without undue experimentation. The subsequently formed coating of matrix precursor or matrix material, which is typically about 0.1 to about 5 microns thick, can be smoothed, if desired, by chemical mechanical polishing (CMP). Poragen can be removed either before or after the CMP process.

A thermal decomposition of the poragen to low molecular weight species that do not leave substantial residue in the matrix is preferred. After applying the composition to the substrate, the solvent is removed; typically, by heating to a moderate temperature. The composition is then heated rapidly to at least a temperature sufficient to cross-link the precursor materials and form the matrix. The poragen is removed by heating to a temperature sufficient to decompose the poragen. When a polystyrene containing poragen is used, it is preferred that the heating occurs in the absence of oxygen. While the drying (solvent removal), curing, and decomposition steps may occur by separate heating steps, it is also possible that a single heating step could be used and it is recognized that even if multiple heating stages are used, more than one of the processes may be occurring in any given heating step.

Preferably, at least 80 percent of the poragen is removed, more preferably at least 90 percent, and most preferably at least 95 percent. Removal of the poragen may be determined by techniques such as infrared spectroscopy, transmission electron microscopy, etc. Removal of the poragen may occur when the poragen degrades into low molecular weight species that can diffuse from the film. Preferably, at least 80 percent of the poragen degrades into low molecular weight species, more preferably at least 90 percent, and most preferably at least 95 percent. Preferably, at least 80 pecent, more preferably at least 90 percent and most preferably at least 95 percent of the thermoplastic poragen degrades into its monomeric units or smaller units.

According to one preferred embodiment, after coating, the coated substrate is heated to a temperature sufficient to cause rapid cure but below the decomposition temperature for the poragen. Suitable methods for performing such a rapid heating step include baking on a hot plate, and rapid thermal anneal under infrared lamps. For the preferred matrix materials, such as those found in WO 98/11149, the composition preferably is raised to a temperature of above about 300° C., more preferably about 350° C., at a rate of at least 20° C. per second, more preferably at least 50° C. per second. This initial curing step need not cause complete cure, so long as the matrix is sufficiently cured as to "lock" the structure of the poragen and the matrix. At least one additional heating step is then performed to fully complete the cure, if necessary, and to decompose the poragen. This subsequent heating step preferably occurs at temperatures above about 400° C., more preferably above about 420° C., and preferably less than about 500° C., more preferably less than 470° C.

According to an alternate embodiment, a single rapid heating step at a rate of preferably at least 20° C. per second, more preferably at least 50° C. per second, to a temperature sufficient to cause both cure and decomposition of the poragen may be used. In this embodiment, either after drying or without using a separate drying step, the temperature is rapidly raised. For the preferred matrix materials, such as those found in WO 98/11149, the temperature is raised to greater than 400° C., and more preferably greater than 420° C.

If multiple layers of the film are desired, the above steps may be repeated. Also, after forming the porous film, that layer may be etched or imaged by known methods to form trenches, vias, or holes, as are desired in manufacture of an integrated circuit article and other microelectronic devices.

The cross-linked hydrocarbon-containing matrix/poragen system is selected such that the matrix forms before the poragen degrades, and the poragen degrades completely or substantially completely before the matrix degrades. It is preferable that the temperature window from cross-linking to degradation of the matrix be wide to have the greatest flexibility in the choice of poragen.

Poragen can be removed by a number of methods including the preferred thermal burnout method discussed above. This thermal burnout may occur in the absence of oxygen or with oxygen present or even added to accelerate the removal of poragen. This second approach is particularly desirable where the thermosetting matrix is comparatively thermo-oxidatively stable. Poragen can also be removed by wet dissolution, wherein the poragen is effectively dissolved away from the thermoset with an appropriate solvent or by dry or plasma removal, wherein plasma chemistry is used to remove the poragen selectively. For example, a solvent or supercritical gas, such as those listed above, can be used to dissolve and remove a dispersed second phase. The second phase may be a thermoplastic material, a diblock polymer, an inorganic material, or any material that can be dispersed on a nanoscale level and is capable of being dissolved in a solvent that can diffuse into and out of a polymer system.

The porous cross-linked matrix of the present invention may be used as one or more of the insulating or dielectric layers in single or multiple layer electrical interconnection architectures for integrated circuits, multichip modules, or flat panel displays. The polymer of the invention may be used as the sole dielectric in these applications, or in conjunction with inorganic dielectrics such as silicon dioxide, silicon nitride, or silicon oxynitride, or with other organic polymers.

The porous hydrocarbon-containing matrix material of the present invention is particularly useful as a low dielectric constant insulating material in the interconnect structure of an integrated circuit, such as those fabricated with silicon or gallium arsenide. The porous hydrocarbon-containing matrix material may also be used in the process for making integrated circuit devices as disclosed in U.S. Pat. Nos. 5,550,405 and 5,591,677, which teachings are incorporated herein by reference.

The following examples are for illustrative purposes only and are not intended to limit the scope of this invention.

EXAMPLE 1

Preparation of a Porous Benzocyclobutene Matrix Using a Reactive Thermoplastic Oligomer
Preparation of Poly(propylene glycol)biscinnamate Into a 250 mL round bottom flask equipped with a magnetic stirrer, an equilibrating addition funnel, and a reflux condenser with a nitrogen inlet was added, with stirring, poly(propylene glycol) having a number average molecular weight of 8000 (38.21 g, 4.78 mmol) and chloroform (40 mL). Pyridine (0.60 g, 7.64 mmol) was then added to the stirred solution. Cinnamoyl chloride (0.64 g, 3.82 mmol) was added dropwise to the solution over 15 minutes. Upon completion of addition, the reaction mixture was heated under reflux for 18 hours. The reaction was then cooled to room temperature. The solution was washed with 10 percent HCl (3×25 mL), then water (1×50 mL), then 1M NaOH (2×25 mL), then water again (1×50 mL), then brine (1×50 mL). The organics were then dried over magnesium sulfate, and the solvent removed to yield the product (37.5 g) the structure of which was confirmed by proton and carbon NMR spectroscopy.
Preparation of a Copolymer Divinylsiloxane-bis-benzocyclobutene and Poly(propylene glycol)biscinnamate Into a glass reactor was placed divinylsiloxane-bis-benzocyclobutene (CAS# 124221-30-3) (4.0 g, 1.024×10$^2$ mol) and poly(propylene glycol)biscinnamate (1.0 g, 1.22× 10$^{-4}$ mol). The mixture, which formed a single phase, was heated at 200° C. for 18 hours, whereupon the material had become white and hard. This material was heated to 325° C. under nitrogen for 50 hours to afford a porous article having a pore size (as determined by transmission electron microscopy) in the range of about 10 to about 50 nm.

EXAMPLE 2

Preparation of a Porous Thin Film of a Benzocyclobutene Matrix Using a Reactive Thermoplastic Oligomer A solution of oligomeric divinylsiloxane-bisbenzocyclobutene, Mw 49600 in mesitylene, 80 parts was combined with 20 parts of the poly(propylene glycol) bis-cinnamate prepared from poly(propylene glycol) Mw 4000. This solution was heated at 165° C. under nitrogen for 4.5 hours to further advance the molecular weight. Upon cooling to room temperature, the total percent solids of the solution was adjusted to 20 percent by addition of the appropriate amount of mesitylene.

Ten milliliters of the above solution was puddled onto a 4 inch silicon wafer and first spun at 500 rpm for 3 seconds followed by spinning at 2,000 rpm for 30 seconds. The wafer was then subjected to the following thermal conditions: hot plate for 5 minutes at 200° C.; 250° C. for 6 minutes; 350° C. for 10 minutes. The wafer was transferred to an oven with a nitrogen atmosphere and held at 300° C. for 9 hours. Transmission electron microscopy indicated the presence of pores which ranged in size from 20–100 nm with an average value of 60–70 nm

EXAMPLE 3

Preparation of a Porous Polyarylene Thin Film Using a Reactive Polystyrene Poragen
Preparation of 3,5-Bis(phenylethynyl)benzoyl Chloride
a.) Preparation of Methyl 3,5-Dibromobenzoate To a 250 mL round bottom flask fitted with a condenser and nitrogen inlet were added 3,5-dibromobenzoic acid (30.06 g, 0.1074 mole), methanol (60 g, 1.87 moles), and concentrated sulfuric acid (1.8 mL). The mixture was heated to reflux for 23 hours and the mixture was cooled to room temperature during which time a solid precipitated. The mixture was cooled in an ice bath and the solid isolated by filtration. The solid was rinsed with cold methanol and then dried in vacuo at 40° C. Reaction and final product were analyzed by GC to monitor reaction progress and assess purity of product.

b.) Coupling of Methyl 3,5-Dibromobenzoate with Phenylacetylene

To a 1 L round bottom flask fitted with a nitrogen inlet was added methyl 3,5-dibromobenzoate (26.4 g, 0.08981 mole), palladium chloride bis(triphenylphosphine) (6.258 g, 0.008916 mole), triphenylphosphine (1.18 g, 0.004504 mole), phenylacetylene (27.40 g, 0.2682 mole), triethylamine (36.13 g, 0.3569 mole), and tetrahydrofuran (THF) (500 mL). The mixture was stirred at room temperature for 20 minutes. Copper (I) iodide (0.428 g, 0.00225 mole) was then added and the mixture stirred at room temperature for 95 hours. Reaction was followed by GC. Solvent was removed in vacuo. Residue was slurried with methanol and isolated by filtration. Solid was dissolved in methylene chloride and filtered through a plug of silica gel in a filter funnel. Solvent was removed in vacuo to give a brown solid.

c.) Preparation of 3,5-Bis(phenylethynyl)benzoic Acid

To a 1 L round bottom flask was added methyl 3,5-bis (phenylethynyl)benzoate (32.7 g, 0.0972 mole) and isopropanol (261 mL). The mixture was heated to reflux until all the solid dissolved. Potassium hydroxide (24.24 g of 45 percent KOH aq., 0.1944 mole) was added and the mixture was kept hot for 4 hours. The mixture was allowed to cool then acidified with concentrated HCl until solid precipitated. The solid was isolated by filtration and dried in vacuo at 80° C. overnight giving a grayish solid (about 22 g). The solid was refluxed in toluene with decolorizing charcoal, filtered hot through filter aid, and cooled during which time a solid precipitated. The solid was isolated by filtration and dried in vacuo overnight. Analysis by high performance liquid chromatography (HPLC) showed the material to be pure. The material was further analyzed by $^1$H-NMR and $^{13}$C-NMR. Spectra were consistent with the desired structure.

d.) Preparation of 3,5-Bis(phenylethynyl)benzoyl Chloride 3,5-Bis(phenylethynyl)benzoic acid (2.7982 g, 0.008680 mole), oxalyl chloride (2.2 mL, 0.02521 mole), and toluene (7 mL) were added to a 50 mL round bottom flask. The mixture was heated at 50° C. until all the solid had dissolved plus an additional hour. The solvent and excess oxalyl chloride were removed by applying a vacuum. The solid was redissolved in toluene at room temperature then solvent removed by applying vacuum. Solid was used subsequently without further purification.

Preparation of a Poly(styrene) Ester of 3,5-Bis (phenylethynyl)benzoic Acid

Charged to a 1.5 L glass polymerization reactor, which had been cleaned with refluxing toluene and dried under vacuum, was 700 mL of cyclohexane (passed through activated alumina). The reactor was heated to 55° C. and 103.3 g of styrene (passed through activated alumina, distilled from calcium hydride and dibutylmagnesium prior to use) were added. The polymerization was initiated by adding 9.0 mL (3.456 mmoles) of 0.384 M sec-butyl lithium solution. After stirring for 1 hour, 0.60 g of ethylene oxide (dried over calcium hydride) was added causing the orange color solution to become colorless. After 30 minutes, 1.778 g (3.456 mmoles, 1.0 equivalent) of 3,5-bis(phenylethynyl)benzoyl chloride, in 10 mL of tetrahydrofuran (passed through activated alumina) were added. After 30 minutes, the solution was cooled and removed from the reactor. The polymer was isolated by precipitating it in 1.5 L of methanol and drying it under vacuum at 80° C. overnight. The yield was quantitative. GPC analysis, versus narrow molecular weight polystyrene standards, of the polymer gave $M_n$=39,353, $M_w$=41,303 and $M_w/M_n$=1.050. Analogously, functionalized polystyrenes with $M_n$ values of about 46,500 and about 50,000 were also prepared.

Preparation of Oligomer Solution from 4,4'-Bis(2,4,5-triphenylcyclopentadien-3-one)diphenyl Ether, 1,3,5-Tris (phenylethynyl)benzene and Polystyrene Ester of 3,5-Bis (phenylethynyl)benzoic Acid To a 500 mL 3-necked round bottom flask was added 4,4'-bis(2,4,5-triphenylcyclopentadienone)diphenyl ether (45.38 g, 0.0580 mole), 1,3,5-tris(phenylethynyl)benzene (14.62 g, 0.0386 mole), polystyrene ester of 3,5-bis (phenylethynyl)benzoic acid ($M_n$=39,353) (15.00 g, 0.000375 mole), and gamma-butyrolactone (140 g). The flask was attached to a nitrogen/vacuum inlet. The magnetically stirred solution was degassed by applying vacuum and refilling with nitrogen five times. The solution was then heated to an internal temperature of 200° C. After 55.5 hours of heating, the solution was allowed to cool to 145° C. then diluted with cyclohexanone (205 g). The solution was then allowed to cool to room temperature. Analysis of the final solution by gel permeation chromatography indicated a $M_n$=5362 and a $M_w$=34022 relative to a polystyrene standard. Similar solutions using other molecular weight reactive polystyrenes were prepared analogously.

Preparation and Evaluation of Porous Thin Film

A resin solution from 4,4'-bis(2,4,5-triphenylcyclopentadien-3-one)diphenyl ether and 1,3,5-tris (phenylethynyl)benzene containing the polystyrene ester of 3,5-bis(phenylethynyl)benzoic acid ($M_n$=46,500) as the poragen was prepared as described above. The solution was applied to a silicon wafer and cast by spin-coating to form a 1.16 µm thick coating. The film was baked on an MTI hot plate at 320° C. for 2 minutes under nitrogen and then at 400° C. for 10 minutes under nitrogen. The coating on the wafer was further heated at 450° C. under nitrogen for 20 minutes in a Blue M oven. The pores were about 120 nm in diameter based on visual inspection of a TEM view of the film. The refractive index was 1.58.

EXAMPLE 4

Preparation of Porous Polyarylene Thin Films Using Non-Reactive Polystyrene Poragens Preparation of Oligomer Solution from 4,4'-Bis(2,4,5-triphenylcyclopentadien-3-one)diphenyl Ether and 1,3,5-Tris(phenylethynyl)benzene Mole Ratio 3:2

To a 500 mL 3-necked round bottom flask was added 4,4'-bis(2,4,5-triphenylcyclopentadienone)diphenyl ether (60.00 g, 0.07662 mole), 1,3,5-tris(phenylethynyl)benzene (19.34 g, 0.0511 mole), and gamma-butyrolactone (185 g). The flask was attached to a nitrogen/vacuum inlet. The magnetically stirred solution was degassed by applying vacuum and refilling with nitrogen five times. The solution was then heated to an internal temperature of 200° C. After 48 hours of heating, the solution was allowed to cool to 145° C. then diluted with cyclohexanone (132 g). The solution was then allowed to cool to room temperature. Analysis of the final solution by gel permeation chromatography indicated a $M_n$=5550 and a $M_w$=30550 relative to a polystyrene standard.

Preparation of Anionically Polymerized Polystyrene

Charged to a 1.5 L glass polymerization reactor, which had been cleaned with refluxing cyclohexane and dried under vacuum, was 750 mL of cyclohexane (passed through activated alumina). The reactor was heated to 55° C. and 103.22 g of styrene (passed through activated alumina and Q5 catalyst bed) were added. The polymerization was initiated by adding 7.8 mL of 1.32 M sec-butyl lithium solution. After stirring for 1 hour, 1 mL of methanol was added to quench the polymerization. The solution was stirred for an additional 30 minutes as the reactor cooled. The polymer was isolated by precipitating it in 2 L of methanol and drying it under vacuum at 90° C. overnight. A total of 101.96 g (99 percent yield) were collected. GPC analysis, versus narrow molecular weight polystyrene standards, of the polymer gave $M_n$=8,296, $M_w$=8,679 and $M_w/M_n$=1.046. Other molecular weights of polystyrene were prepared analogously.

Preparation of Hydroxy Terminated Anionically Polymerized Polystyrene

Charged to a 1 L one-neck round-bottom flask, equipped with magnetic stirring bar, septum port with septum, and a nitrogen inlet adapter, was 208 g of cyclohexane (passed through activated alumina) and 52.64 g of styrene (passed through activated alumina, distilled from calcium hydride and dibutyl magnesium). The polymerization was initiated at room temperature by adding 5.6 mL of 0.624 M sec-butyl lithium solution resulting in an orange colored solution. After 2 hours, 2.31 g of ethylene oxide (dried over calcium hydride) were added to give a colorless solution. After 30 minutes, 2 mL of methanol (MeOH) were added to terminate the polymerization. The polymer was isolated by precipitating it in MeOH and drying under vacuum at 90° C. overnight. The yield was quantitative. GPC analysis, versus narrow molecular weight polystyrene standards, gave $M_n$=14,960, $M_w$=16,035 and $M_w/M_n$=1.072. Other molecular weights of hydroxy terminated polystyrene were prepared analogously.

Preparation of a Star Polystyrene

To a 250 mL round bottom flask fitted with a Dean Stark trap/condenser/nitrogen inlet was added hydroxy terminated polystyrene ($M_n$=4837) (10.00 g, 0.0207 mole) and toluene (150 mL). The mixture was stirred until the solid had dissolved. The mixture was heated to reflux for 2 hours to remove any water azeotropically. The solution was allowed to cool to room temperature then the flask was sealed with a rubber septum. Silicon tetrachloride (59 microliters, 0.000517 mole) was added via syringe and the mixture stirred for 5 minutes. Pyridine (50 microliters) was added via syringe and the mixture stirred for 48 hours at room temperature. The mixture was then heated to reflux for 1.5 hours. The solvent was then removed in vacuo. The residue was dissolved in methylene chloride, washed with HCl (aq.), and NaCl (sat.), then dried ($MgSO_4$) and solvent removed in vacuo. Analysis of the material by gel permeation chromatography indicated a $M_n$=16876 and a $M_w$=17222 relative to polystyrene standards.

Formulation, Thin Film Formation, and Evaluation Using 8700 $M_n$ Polystyrene

Anionically polymerized polystyrene with a $M_n$ of 8700 was added, 20 percent by mass relative to solids, to the oligomer solution from 4,4'-bis(2,4,5-triphenylcyclopentadien-3-one)diphenyl ether and 1,3,5-tris (phenylethynyl)benzene mole ratio 3:2 prepared as described above. The solution was optically transparent with a dark red cast indicating dissolution of the polystyrene into the b-staged resin. The solution was applied to a silicon wafer and cast by spin-coating to form a 3.5 μm thick coating. The film was baked on an MTI hot plate at 320° C. for 2 minutes under nitrogen and then at 400° C. for 10 minutes under nitrogen. The coating on the wafer was further heated at 425° C. under nitrogen for 60 minutes in a Blue M oven. After this latter heating step, about 95 percent of the polystyrene was determined by fourier transform infrared spectroscopy (FTIR) to have been removed. An estimate of the average pore size based on visual inspection of a TEM view of the film was about 300 nm. The index of refraction of the porous coating was about 1.5; this compares to an index of refraction of 1.63 for the fully dense matrix.

The solution containing polystyrene from above was applied to a silicon wafer and cast by spin-coating to form a 3.3 μm thick coating. The film was baked on a hot plate at 380° C. for 2 minutes under nitrogen and then at 400° C. for 10 minutes under nitrogen. The coating on the wafer was then heated in an oven at 425° C. under nitrogen for 6 minutes. The latter heating step removed about 80 percent of the polystyrene as measured by FTIR. The estimated average pore size was 30 nm. Subsequent heating at 450° C. for 20 minutes removed most of the remaining polystyrene. The pore morphology was essentially unchanged with an average pore size of 30 nm.

The solution containing polystyrene from above was applied to a silicon wafer and cast by spin-coating to form a 5.8 μm thick coating. The film was baked on an MTI hot plate at 340° C. for 2 minutes under nitrogen and then at 400° C. for 10 minutes under nitrogen. The coating on the wafer was further heated at 425° C. under nitrogen for 60 minutes in a Blue M oven. An estimate of the average pore size, based on visual inspection of a TEM view of the film, was about 300 nm.

Formulation, Thin Film Formation, and Evaluation Using 15,800 $M_n$ Polystyrene

Anionically polymerized polystyrene with a $M_n$ of 15,800, as purchased from Scientific Polymer Products Inc., was added (20 percent by mass relative to solids) to the oligomer solution from 4,4'-bis(2,4,5-triphenylcyclopentadien-3-one)diphenyl ether and 1,3,5-tris (phenylethynyl)benzene mole ratio 3:2 prepared as described above. Mesitylene was added so that the total solids content was 20 percent. The solution was applied to a silicon wafer and cast by spin-coating to form a 1.85 μm thick coating. The film was baked on a hot plate at 320° C. for 2 minutes under nitrogen and then at 400° C. for 10 minutes under nitrogen. The coating on the wafer was then heated in an oven at 450° C. under nitrogen for 20 minutes. The estimated average pore size was 200 nm. The volume fraction was measured to be between 11 percent and 15 percent using image analysis of the TEM micrographs. The dielectric constant measured with a 0.25 inch diameter parallel plate capacitor was 2.3.

Formulation, Thin Film Formation, and Evaluation Using 12,400 $M_n$ Polystyrene

Anionically polymerized polystyrene with a $M_n$ of 12,400 $M_n$ as purchased from Scientific Polymer Products Inc., was added (20 percent by mass relative to solids) to the oligomer solution from 4,4'-bis(2,4,5-triphenylcyclopentadien-3-one) diphenyl ether and 1,3,5-tris(phenylethynyl)benzene mole ratio 3:2 prepared as described above. The total solids content was adjusted to 15 percent with cyclohexanone. The solution was applied to four nearly identical 200 mm silicon wafers and cast by spin-coating on a MTI 200 mm track coater to form a 0.9 μm thick coating. The films were baked on a hot plate on the track at 150° C. for 2 minutes under nitrogen. Subsequently, two of the films were baked at 320° C. under a 7 psi nitrogen purge on a hot plate module contiguous to the track coater. The remaining wafers were baked at 320° C. under a 55 psi nitrogen purge on a stand-alone module hot plate similar to the hot plate contiguous to the track. All four films were then baked at 400° C. for 10 minutes under the 55 psi nitrogen purge and, finally, heated in an oven at 450° C. under nitrogen for 20 minutes to remove the polystyrene. The wafers baked at 320° C. on the 7 psi nitrogen purge hot plate suffered film loss proportional to the poragen content with the final thickness of 0.68 μm and refractive index of 1.63; indicating film collapse in lieu of pore formation. The wafers baked under the 55 psi purge had a final thickness of about 0.83 μm and a refractive index of 1.55; indicative of pore formation during the 450° C. heating step.

Formulation, Thin Film Formation, and Evaluation of Star Polystyrene in Oligomer Solution from 4,4'-Bis(2,4,5-triphenylcyclopentadien-3-one)diphenyl Ether and 1,3,5-Tris(phenylethynyl)benzene Mole Ratio 3:2

The star polystyrene material from above was added at a 20 weight percent level, relative to solids, to the oligomer solution from 4,4'-bis(2,4,5-triphenylcyclopentadien-3-one)

diphenyl ether and 1,3,5-tris(phenylethynyl)benzene mole ratio 3:2 described above. The solution was applied to a silicon wafer and cast by spin-coating to form a 2.2 μm thick coating. The film was baked on an MTI hot plate at 320° C. for 2 minutes under nitrogen and then at 400° C. for 10 minutes under nitrogen. The coating on the wafer was further heated at 425° C. under nitrogen for 60 minutes in a Blue M oven. An estimate of the average pore size based on visual inspection of a TEM view of the film was about 120 nm. The index of refraction of the porous coating was about 1.56.

EXAMPLE 5

Preparation of a Porous Polyarylene Thin Film Using a Reactive Polyamide Poragen
Preparation of Polyamide from Sebacoyl Dichloride and 2,5-Dimethylpiperazine To a 1 L round bottom flask was added 2,5-dimethylpiperazine (recrystallized from acetone) (10.0000 g, 0.08757 mole) and chloroform (400 mL). Triethylamine (23.1 mL, 0.1656 mole) was added via syringe. Sebacoyl chloride (19.799 g, 0.08279 mole) was weighed into a beaker, dissolved in chloroform (300 mL), and transferred to a dropping funnel attached to the 1 L round bottom flask. The solution of acid chloride was added quickly to the solution of diamine. The dropping funnel was rinsed with chloroform (50 mL) which was added to the reaction mixture. The mixture was stirred at room temperature for 10 minutes. The mixture was then poured into hexanes (2 L) precipitating a white solid. Water (1 L) was added and the mixture stirred. The liquid layer was decanted from the white solid. The solid-was taken up in chloroform and the top aqueous layer was removed and discarded. Solvent was removed in vacuo. The residue was taken up in dimethylformamide and then precipitated into water. The resultant solid was isolated by filtration and dried in vacuo at 100° C. overnight.

Reaction of Polyamide from Sebacoyl Dichloride and 2,5-Dimethylpiperazine with 3,5-Bis(phenylethynyl)benzoyl Chloride 3,5-Bis(phenylethynyl)benzoic acid (0.3224 g, 0.001 mole) was weighed into a 25 mL round bottom flask. Thionyl chloride (10 mL) was added and the mixture stirred for 2 hours at room temperature. The excess thionyl chloride was removed by distillation then by application of vacuum. The resultant solid was dissolved in chloroform and the solvent removed in vacuo twice. The solid was then dissolved in chloroform. The polyamide prepared as described above (5.0 g, 0.0005 mole) was weighed into a 100 mL round bottom flask and dissolved in chloroform (50 mL). The solution of acid chloride was then added followed by triethylamine (0.5 mL). The mixture was stirred at room temperature for 17 hours. The reaction mixture was filtered through a 1 micron filter then diluted with hexanes precipitating a light yellow solid. Solvent was decanted from the solid and additional hexanes were added. The solvent was again decanted off and the solid dried in vacuo at room temperature. A sample was analyzed by gel permeation chromatography which indicated a $M_n$=24100 and a $M_w$=43803.

Preparation of Oligomer Solution from 4,4,'-Bis(2,4,5-triphenyl-cyclopentadien-3-one)-diphenyl Ether, 1,3,5-Tris (phenylethynyl)benzene and Polyamide Endcapped with 3,5-Bis(phenylethynyl)benzamide Groups To a 500 mL 3-necked round bottom flask was added 4,4'-bis(2,4,5-triphenylcyclopentadienone)diphenyl ether (10.0000 g, 0.01277 mole), 1,3,5-tris(phenylethynyl) benzene (4.8340 g, 0.01277 mole), polyamide endcapped with 3,5-bis(phenylethynyl)benzamide groups from above (3.7085 g, 0.000154 mole), and gamma-butyrolactone (43.27 g). The flask was attached to a nitrogen/vacuum inlet. The magnetically stirred solution was degassed by applying vacuum and refilling with nitrogen five times. The solution was then heated to an internal temperature of 200° C. After 48 hours of heating, the solution was allowed to cool to 145° C. then diluted with cyclohexanone (30.89 g). The solution was then allowed to cool to room temperature. Analysis of the final solution by gel permeation chromatography indicated a $M_n$=5071 and a $M_w$=14378 relative to a polystyrene standard. The solution was applied to a silicon wafer and cast by spin-coating to form a 1.5 μm thick coating. The film was baked on an MTI hot plate at 320° C. for 2 minutes under nitrogen and then at 400° C. for 10 minutes under nitrogen. The coating on the wafer was further heated at 450° C. under nitrogen for 20 minutes in a Blue M oven. The pore sizes based on visual inspection of a TEM view of the film appeared to be bimodal with larger pores of about 250 nm diameter and smaller pores of about 30 nm.

EXAMPLE 6

Preparation of a Porous Polyarylene Thin Film Using Latex Particles as Poragens
Formulation of Latex Particles in Oligomer Solution from 4,4'-Bis(2,4,5-triphenylcyclopentadien-3-one)diphenyl Ether and 1,3,5-Tris-(phenylethynyl)benzene Mole Ratio 3:2

Cross-linked latex solutions (such as those available from the Dow Chemical Company) were added at a 20 weight percent level, on a solids to solids basis, to the oligomer solution from 4,4'-bis(2,4,5-triphenylcyclopentadien-3-one) diphenyl ether and 1,3,5-tris(phenylethynyl)benzene mole ratio 3:2 described above, which had been precipitated into water, dried, and redissolved in Dowanol PM Acetate. The solutions were heated to reflux in a round bottom flask fitted with a Dean Stark trap/condenser/nitrogen inlet to remove the water introduced with the latex particles by azeotropic distillation. The resultant solutions were cooled and then used in subsequent processing. A resin solution containing DW-110NA latex (from The Dow Chemical Company) as the poragen was prepared as described. The solution was applied to a silicon wafer and cast by spin-coating to form a 2.7 μm thick coating. The film was baked on an MTI hot plate at 320° C. for 2 minutes under nitrogen and then at 400° C. for 10 minutes under nitrogen. The coating on the wafer was further heated at 450° C. under nitrogen for 20 minutes in a Blue M oven. The pores appeared to be oblate with the long axes in the plane of the film based on visual inspection of a TEM view of the film. The long axes were about 150 nm diameter and short axis was about 50 nm.

EXAMPLE 7

Preparation of a Porous Polyarylene Thin Film Using a Dendritic Polyester as Poragen
Preparation of Boltron H40 Benzoate Into a 250 mL round bottom flask equipped with a magnetic stirrer, equilibrating addition funnel, and a reflux condenser with a nitrogen inlet was added, with stirring, Boltron H40 dendritic polyester polymer having a theoretical molecular weight of 7,316 g permole (5.0 g, 8.75 mmole OH per g, 44 mmole) and THF (70 mL). Pyridine (7 mL) was then added to the stirred solution. Benzoyl chloride (7.03 g, 50 mmol) was added dropwise to the solution over 15 minutes. Upon completion of addition, the reaction mixture was heated under reflux for 2 hours. The reaction was then cooled to room temperature. The solution was filtered, diluted with 200 mL of methylene chloride, washed with 10 percent HCl (3×25 mL), then water (1×50 mL), then 1M NaOH (2×25 mL), then water again (1×50 mL), and then brine (1×50 mL). The organics were then dried over magnesium sulfate, and the solvent removed to yield the crude product, which was further purified by precipitation into methanol to afford 7.4 g product (77 percent); the structure of which was confirmed by proton and carbon NMR spectroscopy.

Synthesis of 1,2,3,4-Tetrakis(phenylethynyl)benzene

In a 250 mL flask was placed 11.81 g (0.030 mole) of 1,2,3,4-tetrabromobenzene (Collins, I., Suschitzky, H., *J. Chem. Soc., C*, 1969, 2337), 27.0 g (0.267 mole) of triethylamine, 13.6 g (0.132 mole) of phenylacetylene, and 60 mL of N,N-dimethyl formamide. The reaction mixture was purged with nitrogen for 15 minutes and then 0.945 g (0.0036 mole) of triphenylphosphine and 0.135 g (0.0006 mole) of palladium acetate were added. After heating the reaction mixture at 80° C. under nitrogen atmosphere for 20 hours, the flask was allowed to cool to room temperature, water (100 mL) and toluene (100 mL) were added. The resulting organic layer was washed with 10 percent HCl, water and saturated NaCl and dried with $Na_2SO_4$. The pure product (5.4 g, 38 percent) was obtained upon removal of the solvent and recrystallization from hexane/toluene mixture. $^1$H NMR ($CDCl_3$, 300 MHz) δ 7.37 (m, 12H), 7.50 (s, 2H), 7.62 (m, 8H). $^{13}$C NMR ($CDCl_3$, 75 MHz) δ 87.3, 88.1, 95.5, 98.2, 123.1, 123.4, 125.7, 128.4, 128.5, 128.8, 130.9, 131.8, 131.9.

Formulation, Thin Film Formation, and Evaluation of Boltron H40 Benzoate +1,2,3,4-Tetrakis(phenylethynyl) benzene in Oligomer Solution from 4,4'-Bis-(2,4,5-triphenylcyclopentadien-3-one)diphenyl Ether and 1,3,5-Tris(phenylethynyl)benzene Mole Ratio 1:1

Boltron H40 Benzoate as prepared above, 25 percent by mass relative to solids, and 1,2,3,4-tetrakis(phenylethynyl)benzene, 20 percent by mass relative to solids, were added to the oligomer solution from 4,4'-bis(2,4,5-triphenylcyclopentadien-3-one)diphenyl ether and 1,3,5-tris(phenylethynyl)benzene mole ratio 1:1 in gamma-butyrolactone and cyclohexanone as described in WO 98/11149. The solution was optically transparent with a dark red cast indicating dissolution of the Boltron H40 Benzoate and 1,2,3,4-tetrakis(phenylethynyl)benzene into the b-staged resin. The solution was applied to a silicon wafer and cast by spin-coating to form a 1.6 μm thick coating. The film was baked on an MTI hot plate at 320° C. for 2 minutes under nitrogen and then at 400° C. for 10 minutes under nitrogen. The coating on the wafer was further heated at 425° C. under nitrogen for 60 minutes in a Blue M oven. An estimate of the average pore size based on visual inspection of a TEM view of the film was about 300 nm. Also, smaller pore structure was apparent with sizes between 5 nm to 10 nm.

EXAMPLE 8

Preparation of a Porous Polyarylene Thin Film Using Block Copolymers as Poragens Preparation of Poly(styrene-block-methyl methacrylate) (PS-b-PMMA)

Charged to a 500 mL one-neck round bottom flask, equipped with magnetic stirring bar, septum port with septum, and an addition funnel with septum and nitrogen inlet, was 193 g of tetrahydrofuran (passed through activated alumina). The flask was cooled to −78° C. and 12.73 g of styrene (passed through activated alumina and Q5 catalyst bed) were added. The polymerization was initiated by adding 1.15 mL (0.84 mmole) of 0.733 M sec-butyl lithium solution resulting in an orange colored solution. After 2 hours, the poly(styrene) (PS) block was sampled by removing an aliquot and adding it to methanol (MeOH), and 0.19 g (1.05 mmoles, 1.25 equivalent) of diphenylethylene (distilled from diphenylhexyl lithium) were added to give a dark red color. After 25 minutes, 13.18 g of methyl methacrylate (MMA) (distilled from calcium hydride and triethyl aluminum) were added dropwise via the addition funnel over a 20 minute period. The red color dissipated after the first several drops of MMA. After 1 hour, the polymerization was terminated by adding 0.2 mL of MeOH. The solution was allowed to warm to room temperature and the polymer was isolated by precipitating it in 600 mL of MeOH and collecting it by filtration. Both polymers were dried under vacuum at 60° C. for several hours. A total of 24.69 g (95 percent yield) of PS-b-PMMA were collected. GPC analysis, versus narrow molecular weight polystyrene standards, of the PS block gave $M_n$=14,567, $M_w$=15,821 and $M_w/M_n$=1.086; the PS-b-PMMA copolymer gave $M_n$=26,825, $M_w$=28,893 and $M_w/M_n$=1.077. NMR analysis of the block copolymer showed the PMMA block to have $M_n$=15,364 giving $M_n$=29,913 for the copolymer.

Preparation of Poly(butadiene-block-ε-caprolactone) (PB-b-PCL)

Charged to a 1.5 L glass polymerization reactor, which had been cleaned with refluxing toluene and dried under vacuum, was 650 mL of cyclohexane (passed through activated alumina). The reactor was heated to 50° C. and 32.55 g of 1,3-butadiene (passed through activated alumina and Q5 catalyst bed) were added. The polymerization was initiated by adding 7.0 mL (9.1 mmoles) of 1.3 M sec-butyl lithium solution. After stirring for 2.5 hours, the poly (butadiene) (PB) block was sampled, by removing an aliquot and adding it to methanol (MeOH), and 1.58 g of (3.59 mmoles, 3.9 eqivalent) of ethylene oxide (dried over calcium hydride) were added. The reactor temperature was increased to 70° C. After 20 minutes, 9.1 mL (9.1 mmoles, 1.0 eqivalent) of 1.0 M diethylaluminum chloride and 0.1 mL of tetrahydrofuran (passed through activated alumina) were added to give a turbid solution. The reactor was cooled to 60° C. and 34.81 g of ε-caprolactone (distilled from calcium hydride twice) were added to give a milky solution. After 90 minutes, 0.5 mL of MeOH were added to terminate the polymerization. The solution was stirred for an additional 30 minutes to assure complete termination and then was added to 0.75 g of 2,6-di-tert-butyl-4-methyl phenol. The polymer was isolated by precipitating it in 1.2 L of methanol and drying it under vacuum at 50° C. for several hours. A total of 48.1 g (71 percent yield) of PB-b-PCL were collected. GPC analysis, versus narrow molecular weight poly(butadiene) standards, of the PB block gave $M_n$=4,890, $M_w$=5,080 and $M_w/M_n$=1.039; the PB-b-PCL copolymer gave $M_n$=5,655, $M_w$=6,629 and $M_w/M_n$=1.172. NMR analysis of the block copolymer showed the PCL block to have $M_n$=4,794 giving $M_n$=9,685 for the copolymer.

Formulation, Thin Film Formation, and Evaluation of Poly (styrene-block-methyl methacrylate) (PS-b-PMMA) in Oligomer Solution from 4,4'-Bis(2,4,5-triphenylcyclopentadien-3-one)-diphenyl Ether and 1,3,5-Tris(phenylethynyl)benzene Mole Ratio 3:2

The block copolymer of polystyrene and PMMA as described above was added (20 percent by mass relative to solids) to the oligomer solution from 4,4'-bis(2,4,5-triphenylcyclopentadien-3-one)diphenyl ether and 1,3,5-tris (phenylethynyl)benzene mole ratio 3:2 described above. The solution was optically transparent with a dark red cast indicating dissolution of the block copolymer into the b-staged resin. The solution was applied to a silicon wafer and cast by spin-coating to form a 1.94 µm thick coating. The film was baked on a MTI hot plate at 400° C. for 10 minutes under nitrogen. The coating on the wafer was further heated at 4500° C. under nitrogen for 20 minutes in a Blue M oven. An estimate of the average pore size based on visual inspection of a TEM view of the film was about 200 nm.

Formulation, Thin Film Formation, and Evaluation of Poly (butadiene-block-b-caprolactone) (PB-b-PCL) in Oligomer Solution from 4,4'-Bis(2,4,5-triphenylcyclopentadien-3-one)diphenyl Ether and 1,3,5-Tris(phenylethynyl)benzene Mole Ratio 3:2

The block copolymer of polystyrene and polycaprolactone described above (was added, 20 percent by mass relative to solids) to the oligomer solution from 4,4'-bis(2,4,5-triphenylcyclopentadien-3-one)diphenyl ether and 1,3,5-tris(phenylethynyl)benzene mole ratio 3:2 described above. The solution was optically transparent with a dark red cast indicating dissolution of the block copolymer into the b-staged resin. The solution was applied to a silicon wafer and cast by spin-coating to form a 2.85 µm thick coating. The film was baked on a MTI hot plate at 320° C. for 2 minutes under nitrogen and then at 400° C. for 10 minutes under nitrogen. The coating on the wafer was further heated at 450° C. under nitrogen for 20 minutes in a Blue M oven. An estimate of the average pore size based on visual inspection of a TEM view of the film was about 20 nm.

EXAMPLE 9

Preparation of a Porous Benzocyclobutene Film Using a Functionalized Dendrimer as Poragen A polyamidoamine dendrimer, generation 2, available from Dendritech, Inc., was functionalized with phenylpropiolic acid to afford a dendrimer with 16 phenylpropiolamides at the periphery. The functionalized propiolamide (0.3 g) was added to 6.0 g of a solution of 25 weight percent oligomeric divinylsiloxane-bis-benzocyclobutene in N-cyclohexylpyrrolidinone. The mixture was warmed to 60° C. and then cooled to room temperature and allowed to stand for 48 hours. The weight ratio of dendrimer to benzocyclobutene oligomer was 16.7:83.3 and the total percent solids was 28.6 percent. The prepolymer solution was further diluted with 2.7 g of N-cyclohexylpyrrolidinone to afford a final solution of 20 weight percent solids. This solution was spun onto a 4 inch silicon wafer (3 seconds per 500 rpm, then 30 seconds per 2000 rpm) and then subjected to the following thermal treatment: 5 minutes per 200° C.; 6 minutes per 250° C.; hot plate 10 minutes per 350° C. and oven 9 hours per 300° C. The film was slightly hazy and when looked at by transmission electron microscopy (TEM) showed a distribution of spherical, closed cell pores ranging in diameter from 5–200 nm.

EXAMPLE 10

Preparation of a Porous Polyarylene Thin Film Using a Non-Reactive Star Polyethylene Glycol as Poragen Preparation of 8 Arm Poly(ethylene glycol)benzoate Into a 250 mL round bottom flask equipped with a magnetic stirrer, equilibrating addition funnel, and a reflux condenser with a nitrogen inlet was added, with stirring, branched PEG (8 arms, from Shearwater Polymers) polymer having a molecular weight of 10,000 g per mole (5.0 g, 4 mmole OH) and methylene chloride (40 mL). Triethylamine (5 mL) was then added to the stirred solution. Benzoyl chloride (1.69 g, 12 mmole) in 20 mL methylene chloride was added dropwise to the solution over 15 minutes. Upon completion of addition, the reaction mixture was heated under reflux for 2 hours. The reaction was then cooled to room temperature. The solution was washed with 10 percent HCl (3×25 mL), then water (1×50 mL), then 1M NaOH (2×25 mL), then water again (1×50 mL), then brine (1×50 mL). The organics were then dried over magnesium sulfate, and the solvent removed to yield the crude product, which was further purified by precipitation into ether to afford 4.4 g of product (81 percent). The structure of which was confirmed by proton and carbon NMR spectroscopy.

Formulation, Thin Film Formation, and Evaluation of 8-Arm Star Poly(ethylene glycol)benzoate in Oligomer Solution from 4,4'-Bis(2,4,5-triphenylcyclopentadien-3-one)diphenyl Ether and 1,3,5-Tris(phenylethynyl)benzene Mole Ratio 3:2

The 8-arm star poly(ethylene glycol) benzoate described above, was added, 20 percent by mass relative to solids, to the oligomer solution from 4,4'-bis(2,4,5-triphenylcyclopentadien-3-one)diphenyl ether and 1,3,5-tris (phenylethynyl)benzene mole ratio 3:2 described above. The solution was optically transparent with a dark red cast indicating dissolution of the poragen into the b-staged resin. The solution was applied to a silicon wafer and cast by spin-coating to form a 2.5 µm thick coating. The film was baked on a MTI hot plate at 400° C. for 2 minutes under nitrogen and then coating on the wafer was further heated at 450° C. under nitrogen for 20 minutes in a Blue M oven. An estimate of the average pore size based on visual inspection of a TEM view of the film was about 180 nm.

EXAMPLE 11

Preparation of a Porous Polyarylene Thin Film Using a Polystyrene-block-polyarylene Preparation of Polystyrene Ester of 4-Phenylethynylbenzoic Acid Into a 250 mL round bottom flask equipped with a magnetic stirrer, an equilibrating addition funnel, and a reflux condenser with a nitrogen inlet was added, with stirring, polystyrene, monohydroxyl terminated polystyrene (from Scientific Polymer Products) having a molecular weight of 10,000 g per mole (10.0 g, 1.0 mmole) and THF (50 mL). Pyridine (5 mL) was then added to the stirred solution. 4-Phenylethynylbenzoyl chloride (0.96 g, 4 mmol) in 10 ml THF was added dropwise to the solution over 15 minutes. The reaction mixture was heated under reflux for 2 hours and then cooled to room temperature. The solution was filtered, diluted with 200 mL of chloroform and washed with 10 percent HCl (25 mL), then water (50 mL), then 1M NaOH (25 mL), then water again (50 mL), and then brine (50 mL). The organics were then dried over magnesium sulfate and the solvent removed to yield the crude product, which was further purified by precipitation into methanol to afford 9.3 g of product.

Preparation and Thin Film Formulation and Evaluation of Oligomer Solution from 4,4'-Bis(2,4,5-triphenylcyclopentadien-3-one)diphenyl Ether, 1,3,5-Tris (phenylethynyl)benzene and Polystyrene Ester of 4-Phenylethynylbenzoic Acid To a 250 mL 3-necked round bottom flask was added 4,4'-bis(2,4,5-triphenylcyclopentadienone)diphenyl ether (8.0 g, 0.0102 mole), 1,3,5-tris(phenylethynyl)-benzene (3.71 g, 0.0098 mole), polystyrene ester of 4-phenylethynyl benzoic acid ($M_w$=10,000 g per mole) (3.0 g, 20 percent relative to other solids), and gamma-butyrolactone (37.3 g). The flask was attached to a nitrogen/vacuum inlet. The magnetically stirred solution was degassed by applying vacuum and refilling with nitrogen five times. The solution was then heated to an internal temperature of 200° C. After 46 hours of heating, the solution was allowed to cool to 145° C. then diluted with cyclohexanone (19.6 g). The solution was then allowed to cool to room temperature. The solution was applied to a silicon wafer and cast by spin-coating to form a 4.7 μm thick coating. The film was baked on a MTI hot plate at 320° C. for 2 minutes under nitrogen and then at 400° C. for 10 minutes under nitrogen. The coating on the wafer was further heated at 425° C. under nitrogen for 60 minutes in a Blue M oven. An estimate of the average pore size based on visual inspection of a TEM view of the film was about 110 nm.

EXAMPLE 12

Preparation of a Porous Perfluorcyclobutane Thermoset Thin Film Using a Gel-Swell-Cure Procedure In this example, we used an oligomeric solution of perfluorcyclobutene resin dissolved in mesitylene. The resin was spun coated onto 4 inch silicon wafers at 3000 rpm's such that the thickness was near 1 micron. The resin was then reacted to past its gel point by placing the wafers in an oven which was idling at 161° C.; the oven ramped to 175° C. in 5 minutes and then held at 175° C. for 46 minutes. After cooling to room temperature, the wafers were exposed to either no swelling solution; a solution of 90 percent mesitylene and 10 percent styryl-benzocyclobutene by weight; or a solution of a solution of 90 percent mesitylene and 10 percent styryl-benzocyclobutene by weight. The exposure was done by puddling the solution onto the wafer for 1 minute in order to swell the network. The wafer was then spun at 3000 rpms for 45 seconds to remove excess solvent. After spinning, the wafer was placed onto a hot plate under nitrogen purge for 1 minute at 325° C. to cure the film. Wafers were sampled at various points in the above process and the index of refraction was measured using ellipsometry at five different points and then averaged. The results are listed in the table below.

Table of Results for Gel-Swell-Cure Experiments

| Wafer | Process Sequence | Swell Solution | Index of Refraction |
|---|---|---|---|
| 1 | Gel | None | 1.547 ± 0.009 |
| 2 | Gel + Cure (no swell) | None | 1.521 ± 0.006 |
| 3 | Gel + Swell + Cure | 10% styryl-BCB | 1.490 ± 0.004 |
| 4 | Gel + Swell + Cure | 25% styryl-BCB | 1.447 ± 0.019 |

What is claimed is:

1. A composition comprising: a) a hydrocarbon-containing matrix precursor; and b) a poragen wherein the matrix precursor is selected from benzocyclobutenes; and b-staged products of benzocyclobutene.

2. The composition of claim 1 wherein the matrix precursor comprises a b-staged reaction product of divinylsiloxane-bis-benzocyclobutene.

3. The composition of claim 1 wherein the poragen is a polymer.

4. The composition of claim 1 wherein the poragen is a polymer which degrades at temperatures below the thermal stability temperature of the cross-linked hydrocarbon-containing material.

5. The composition of claim 1 wherein the poragen is a block copolymer.

6. The composition of claim 1 wherein the poragen is a homopolymer.

7. The composition of claim 1 wherein the poragen is polystyrene and the cross-linked hydrocarbon-containing material is a polyarylene.

8. The composition of claim 1 wherein the poragen reacts with the matrix precursor to form groups that are pendant from the cross-linked hydrocarbon-containing material.

9. The composition of claim 1 wherein the poragen is a particle having an average diameter of about 1 to about 50 nm, said particle being selected from dendrimers, hyperbranched polymers, and latex particles.

10. The composition of claim 1 wherein the poragen is a reactive or non-reactive: a) diblock polymer, wherein one of the blocks is compatible with cross-linked polymer matrix resin and the other block is incompatible therewith; b) dendrimer; c) latex particle; d) solvent; e) gas; f) thermoplastic oligomer or g) material that can be dissolved in a solvent or supercritical gas.

11. The composition of claim 1 further comprising a solvent.

12. The composition of claim 11 wherein the solvent is selected from mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and ethers or hydroxy ethers such as dibenzylethers, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether, tripropylene glycol methyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof.

13. The composition of claim 1 wherein the poragen is selected from poly(alkylene glycol), in which the alkylene group has 2 to 5 carbon atoms, block copolymers of polyalkylene glycols, polyamidoamine dendrimers, and polycaprolactones.

14. The composition of claim 1 wherein the poragen is selected from reactive and non-reactive polystyrene containing polymers, hyperbranched polyesters, cross-linked polystyrene containing latexes, aliphatic polyamides, polyalkylene glycol-containing polymers wherein the alkylene group has 2 to 5 carbon atoms, block copolymers of styrene and acrylates or methacrylates, and block copolymers of butadiene and caprolactones.

15. The composition of claim 1 wherein the poragen is a cross-linked latex particle.

* * * * *